(12) United States Patent
Yoon et al.

(10) Patent No.: US 8,586,458 B2
(45) Date of Patent: Nov. 19, 2013

(54) PROCESS OF PREPARING CARBON NANOTUBE HAVING IMPROVED CONDUCTIVITY

(75) Inventors: Seon-mi Yoon, Yongin-si (KR); Seong-jae Choi, Seoul (KR); Hyeon-jin Shin, Suwon-si (KR); Jae-young Choi, Suwon-si (KR); Sung-jin Kim, Seoul (KR); Young-hee Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 406 days.

(21) Appl. No.: 12/043,519

(22) Filed: Mar. 6, 2008

(65) Prior Publication Data

US 2008/0296683 A1    Dec. 4, 2008

(30) Foreign Application Priority Data

May 30, 2007    (KR) .................. 10-2007-0052868

(51) Int. Cl.
*H01L 21/04*    (2006.01)
*H01L 51/00*    (2006.01)

(52) U.S. Cl.
USPC ............. 438/510; 977/749; 977/849; 257/40; 257/E51.038; 257/E51.04

(58) Field of Classification Search
USPC ............. 977/749, 847; 257/E51.038, E51.04
See application file for complete search history.

(56) References Cited

U.S. PATENT DOCUMENTS

| | | | |
|---|---|---|---|
| 6,641,793 B2 * | 11/2003 | Haddon et al. ............ 423/447.2 | |
| 2002/0125470 A1 | 9/2002 | Hoenlein et al. | |
| 2004/0197546 A1 | 10/2004 | Rinzler et al. | |
| 2006/0029537 A1 | 2/2006 | Zhang et al. | |
| 2006/0038179 A1 | 2/2006 | Afzali-Ardakani et al. | |
| 2007/0221913 A1 * | 9/2007 | Lee et al. ......................... 257/40 |
| 2008/0023066 A1 * | 1/2008 | Hecht et al. ................... 136/256 |
| 2008/0088219 A1 * | 4/2008 | Yoon et al. .................... 313/326 |
| 2009/0317660 A1 * | 12/2009 | Heintz et al. .................. 428/688 |

FOREIGN PATENT DOCUMENTS

| | | |
|---|---|---|
| CN | 1775667 A | 5/2006 |
| JP | 2006-240898 A | 9/2006 |
| KR | 1020040106947 A | 12/2004 |
| KR | 1020060060144 A | 6/2006 |
| WO | 2006085902 A2 | 8/2006 |

OTHER PUBLICATIONS

IUPAC. Compendium of Chemical Terminology, 2nd ed. (the "Gold Book"). Compiled by A. D. McNaught and A. Wilkinson. Blackwell Scientific Publications, Oxford (1997). XML on-line corrected version: http://goldbook.iupac.org (2006-) created by M. Nic, J. Jirat, B. Kosata; updates compiled by A. Jenkins. ISBN 0-9678550-9-8. doi:10.1351/goldbook.*
Definition of Oxidizability, Merriam-Webster, 2013, Online edition. Retrieved Mar. 11, 2013 from http://www.merriam-webster.com/dictionary/oxidizability, p. 1 of 3.*

(Continued)

*Primary Examiner* — Michael Jung
(74) *Attorney, Agent, or Firm* — Cantor Colburn LLP

(57) ABSTRACT

Provided are a method of doping carbon nanotubes, p-doped carbon nanotubes prepared using the method, and an electrode, a display device or a solar cell including the carbon nanotubes. Particularly, a method of doping carbon nanotubes having improved conductivity by reforming the carbon nanotubes using an oxidizer, doped carbon nanotubes prepared using the method, and an electrode, a display device or a solar cell including the carbon nanotubes are provided.

7 Claims, 1 Drawing Sheet

(56) References Cited

OTHER PUBLICATIONS

Clover, A.M. in "The Auto-Oxidation of Chloroform", 1923, J. Am. Chem. Soc. 45(12), pp. 3133-3138.*

M.S. Fuhrer, et al., "Crossed Nanotube Junctions," Science, vol. 288, pp. 494-497 (2000).

Paul C.P. Watts, et al., "Are Bulk Defective Carbon Nanotubes Less Electrically Conducting?," Nano Letters, vol. 3, No. 4, pp. 549-553 (2003).

European Extended Search Report; Application No. 08157017.8 dated Jul. 15, 2010.

Duclaux, L., Review of the doping of carbon nanotubes (multiwalled and single-walled), Carbon, vol. 40, No. 10. (2002), pp. 1751-1764.

Rowell, M. W. et al., Organic Solar Cells with Carbon Nanotube Network Electrodes, Applied Physics Letters, 88 (2006), 233506-1-233506-3.

European Office Action for Application No. 08157017.8-1235 dated May 31, 2011.

Chinese Office Action for Publication No. 200810107802.7 dated Nov. 24, 2011.

Rinzler, A.G. et al., Unraveling Nanotubes: Field Emission from an Atomic Wire, Science, 1995, vol. 269 (5230): 1550-1553.

Claves, D., Hole-Doping of Fullerenes and Nanotubes by Way of Intercalation Chemistry, J. Nanosci Nanotechnol. 2007; 7(4-5): 1221-1238.

Korean Office Action issued Jun. 30, 2008 for Application No. 10-2007-0052868.

* cited by examiner

PROCESS OF PREPARING CARBON NANOTUBE HAVING IMPROVED CONDUCTIVITY

CROSS-REFERENCE TO RELATED APPLICATIONS

This application claims the benefit of Korean Patent Application No. 10-2007-0052868, filed on May 30, 2007, and all the benefits accruing therefrom under 35 U.S.C. §119, hereby incorporated by reference.

BACKGROUND

1. Field of the Invention

This disclosure relates to carbon nanotubes having improved electrical conductivity, a process of preparing the same, and an electrode comprising the carbon nanotube. This disclosure also relates to a method of producing carbon nanotubes having improved electrical conductivity and to a method of manufacturing an electrode that comprises the carbon nanotubes.

2. Description of the Related Art

In general, devices such as display devices and solar cells that transmit light to form images or to generate electric power use transparent electrodes. Indium tin oxide (ITO) is widely known as a transparent electrode and has a wide range of applications. However, the increased costs of manufacturing ITO, render it uneconomical in many applications. In particular, when a transparent electrode formed of ITO is bent, it begins to undergo cracking thereby causing an increase in its electrical resistance. Accordingly, the use of ITO electrodes may cause deterioration of quality in flexible devices, and there is therefore a need to develop a novel electrode that is optically transparent and that can be used in flexible devices. A transparent electrode including carbon nanotubes can be used in a wide range of devices, such as liquid crystal display (LCD) devices, organic light emitting display devices (OLEDs), electronic paper like displays, or solar cells.

A transparent electrode including carbon nanotubes must have conductivity, transparency, and flexibility. Generally, a transparent electrode including carbon nanotubes are prepared by dispersing a carbon nanotube powder in a solution to prepare a carbon nanotube ink and then coating the carbon nanotube ink on a substrate. The prepared transparent electrode including the carbon nanotubes has a network structure formed of carbon nanotubes. As a result, electrons flow in the carbon nanotubes themselves and between the carbon nanotubes to function as an electrode. Accordingly, conductivity of the electrode including the carbon nanotubes is determined by flowability of the electrons in the carbon nanotubes themselves and between the carbon nanotubes.

According to the results of recent research, in the electrode having the lattice structure of carbon nanotubes, when the number of carbon nanotubes is sufficiently large that the carbon nanotubes can contact each other, that is, when the number of carbon nanotubes is equal to or higher than a critical number, a carbon nanotube network film is not affected by the resistance of the carbon nanotubes themselves and mainly affected by the contact resistance between the carbon nanotubes (Nanoletter 2003, 3, 549). Thus, reduction in the contact resistance between the carbon nanotubes is critical to improvement of the conductivity of transparent electrode including carbon nanotubes. According to the results of other recent research, it was found that contact conductivity varies because of properties of a mixture of semiconducting and metallic carbon nanotubes (Science, 288, 494). The sheet resistance of the random network SWCNTs is determined by the sum of resistances of the intrinsic SWCNT network and tube-tube contact. The tube-tube contact is composed of metal-metal and semiconductor-semiconductor junctions that give ohmic behavior, and a metal-semiconductor junction that forms a Schottky barrier. When electrons flow from a semiconducting carbon nanotube to a metallic carbon nanotube, a Schottky barrier is generated causing relatively low contact conductivity. Thus, there is a need to increase contact conductivity of sCNT-sCNT or sCNT-mCNT, or to reduce the contact amount.

SUMMARY

Disclosed herein is a method of doping carbon nanotubes to have improved electrical conductivity. Disclosed herein too are carbon nanotubes prepared by the method of doping carbon nanotubes.

Disclosed herein too is a film that comprises the doped carbon nanotubes. Disclosed herein too is an electrode that comprises the carbon nanotubes having improved electrical conductivity.

Disclosed herein too is a display device that comprises an electrode that comprises the carbon nanotubes having improved electrical conductivity.

Disclosed herein too is a solar cell that comprises an electrode that comprises the carbon nanotubes having improved electrical conductivity.

Disclosed herein too is a thin film transistor that comprises the carbon nanotubes having improved electrical conductivity.

Disclosed herein too is a method of doping carbon nanotubes, the method including: preparing an oxidizer solution comprising an oxidizer and an organic solvent; and doping carbon nanotubes using the oxidizer solution.

The doping of the carbon nanotubes may include mixing a carbon nanotube powder with the oxidizer solution and stirring the mixture.

The organic solvent may be capable of dispersing the carbon nanotubes.

The organic solvent is selected from the group consisting of dimethylformamide (DMF), 1,2-dichloro ethane (DCE), 1,2-dichloro benzene (ODCB), nitromethane, tetrahydrofuran (THF), N-methylpyrrolidone (NMP), nitromethane, dimethyl sulfoxide, nitrobenzene butyl nitrite, and combinations comprising at least one of the foregoing solvents.

The oxidizer solution may further include a dispersing agent.

The doping of the carbon nanotubes may include dipping or coating a film formed of the carbon nanotubes using the oxidizer solution.

The organic solvent may have oxidizability.

The oxidizer may have an oxidation number of at least two.

The oxidizer is selected from the group consisting of halogen oxides, sulfur oxides, metal halides, nitrogen oxides, metal oxyacid-based compounds, benzoquinone-based compounds, $O_3$ and $H_2O_2$, and combinations comprising at least one of the foregoing oxidants.

Disclosed herein is a film that comprises doped carbon nanotubes that have a conductivity of less than $10^3$ Ω/sq, and a transmittance of at least 75%.

Disclosed herein are doped carbon nanotubes that are prepared by doping the carbon nanotubes using an oxidizer solution comprising an oxidizer and an organic solvent. Disclosed herein too is an electrode that comprises doped carbon nanotubes prepared by a method of doping carbon nanotubes using an oxidizer including an oxidizer and an organic solvent. Disclosed herein too are display devices that comprise the electrode.

The display device may be selected from the group consisting of an organic light emitting display device (OLED), a liquid crystal display (LCD) device, and an E-paper device.

Disclosed herein too are solar cells that comprise the electrode.

Disclosed herein too are thin film transistors that comprise the doped carbon nanotubes having improved conductivity.

BRIEF DESCRIPTION OF THE DRAWINGS

The above and other features and advantages will become more apparent by describing in detail exemplary embodiments thereof with reference to the attached drawings in which.

DETAILED DESCRIPTION

Figure 1:
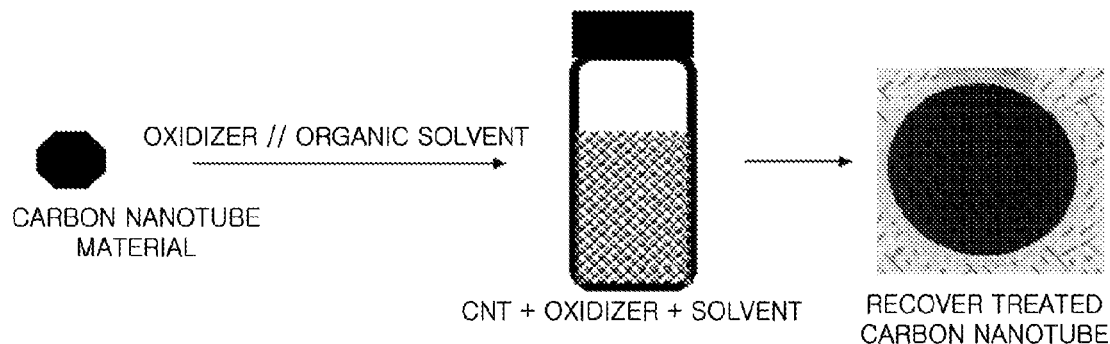
FIG. 1 schematically shows a process of doping carbon nanotube powder using an oxidizer.

Hereinafter, the doped carbon nanotubes and the display devices manufactured therefrom will now be described more fully with reference to the accompanying drawings, in which exemplary embodiments are depicted.

Carbon nanotubes are a hollow carbon substance in which a sheet of graphite having a hexagonal lattice of carbon is rolled into a cylindrical shape. Carbon nanotubes having a structure containing only one graphite sheet are referred to as single wall carbon nanotubes while carbon nanotubes having several sheets, generally about 2 to 5 sheets, are referred to as thin multi wall carbon nanotubes. Further, carbon nanotubes having a multilayer structure that have more sheets than the thin multi wall carbon nanotubes are referred to as multi wall carbon nanotubes.

In order to improve contact conductivity in a carbon nanotube powder or in a carbon nanotube film having a network of carbon nanotubes, p-doping of the carbon nanotubes is performed using an oxidizer.

A method of doping carbon nanotubes comprises preparing an oxidizer solution that comprises an oxidizer and an organic solvent, and doping the carbon nanotubes using the oxidizer solution.

The oxidizer solution is prepared by dissolving an oxidizer in an organic solvent to a predetermined concentration. The oxidizer is preferably dissolved in an organic solvent since water as a solvent has a negligible effect on the doping of the carbon nanotubes. Any organic solvent that can dissolve the oxidizer or disperse the carbon nanotubes can be used without limitation, and preferably a polar organic solvent may be used. Examples of the organic solvent can be dimethylformamide (DMF), 1,2-dichloro ethane (DCE), 1,2-dichloro benzene (ODCB), nitromethane, tetrahydrofuran (THF), N-methylpyrrolidone (NMP), dimethyl sulfoxide, nitrobenzene, butyl nitrite, or the like, or a combination comprising at least one of the foregoing organic solvents.

An organic solvent having oxidizability may be used to increase oxidizability of the oxidizer. Examples of organic solvents that have oxidizability may be nitromethane, dimethyl sulfoxide, nitrobenzene, butyl nitrite, or the like, or a combination comprising at least one of the foregoing organic solvents.

Any oxidizer having oxidizability can be used to oxidize the carbon nanotubes, but an oxidizer having an oxidation number of at least two may be used to improve conductivity.

The oxidizer may be at least one compound selected from the group consisting of halogen oxyacid-based compounds, sulfur oxyacid-based compounds, metal halides, nitrogen oxyacid-based compounds, d-block metal oxides, benzoquinone-based compounds, $O_3$ and $H_2O_2$, or the like, or a combination comprising at least one of the foregoing organic solvents. The halogen oxyacid-based compounds may be iodine oxidizers or chloride oxidizers, and particularly iodylbenzene, 2-iodoxybenzoic acid, Dess-Martin periodinane, sodium hypochlorite, sodium chlorite, sodium chlorate, sodium perchlorate, silver chlorate, silver perchlorate, or the like, or a combination comprising at least one of the foregoing halogen oxyacid-based compounds. The sulfur oxyacid-based compounds may be DMSO, $H_2SO_4$, $KHSO_5$, $KHSO_4$, $K_2SO_4$, $FSO_3H$, $CF_3SO_3H$, $NH(CF_3SO_3H)$, $AgN(CF_3SO_3H)$, $(NH_4)_2Ce(SO_4)_3$, or the like, or a combination comprising at least one of the foregoing sulfur oxyacid-based compounds. The metal halides may be a metal salt including silver ions, gold ions, or cerium ions. Examples of the metal halides are $FeCl_3$, $MoCl_5$, $WCl_5$, $SnCl_4$, $MoF_5$, $RuF_5$, $TaBr_5$, $SnI_4$, $HAuCl_4$, $AuCl_3$, $NaClO_2$, $NaClO_3$, or the like, or a combination comprising at least one of the foregoing metal halides. The nitrogen oxyacid-based compounds may be nitric acid, nitrogen dioxides or nitrogen oxides, and particularly $AgNO_3$, $NO_2F$, $NO_2Cl$, $N_2O_5$, $NO_2BF_4$, $(NH_4)_2Ce(NO_3)_6$, $CH_3NO_2$, $C_6H_5NO_2$, $CH_3ONO$, $NO(SbCl_6)$, $NOBF_4$, $NOClO_4$, $NOSO_4H$, $C_6H_5NO$, $NOCl$, $NOF$, $NOBr$, or the like, or a combination comprising at least one of the foregoing nitrogen oxyacid-based compounds. The d-block metal oxides, may be $KMnO_4$, $BaMnO_4$, $OsO_4$, or the like, or a combination comprising at least one of the foregoing d-block metal oxides. The benzoquinone-based compounds may be benzoquinone, tetrachloro benzoquinone, dichlorodicyano benzoquinone, tetracyano-quinodimethane, or the like, or a combination comprising at least one of the foregoing benzoquinone-based compounds.

The carbon nanotubes are doped with the oxidizer solution, as shown in the FIG. 1. For example, as shown in FIG. 1, the carbon nanotube powder is immersed in the oxidizer solution for a predetermined period of time. The doping may be performed for a predetermined time period for sufficient oxidization of the carbon nanotubes and preferably for about 4 to about 12 hours. When the doping is performed for less than 4 hours, the electrical conductivity is not sufficiently improved since the doping is not sufficiently performed. On the other hand, when the doping is performed for longer than 12 hours, the electrical conductivity is not increased any further.

When the carbon nanotube powder is immersed in the oxidizer solution, a stirring process may be simultaneously performed to enlarge the contacts between the carbon nanotubes and the oxidizer. The stirring process can be performed via mechanical stirring or an ultrasonic treatment (ultrasonication). While stirring, a dispersing agent that can effectively disperse the carbon nanotubes, may be added to the oxidizer solution. The dispersing agent can also prevent reagglomeration of the carbon nanotubes.

After the carbon nanotube powder is immersed in the oxidizer solution for the requisite period of time to achieve doping, a substrate (comprising a transparent film) can be immersed into the oxidizing solution that comprises the carbon nanotubes. The doping may be performed for 10 seconds to 5 hours. When the doping is performed for less than 10 seconds, conductivity is not sufficiently improved since the doping is not sufficiently performed. On the other hand, when the doping is performed for longer than 5 hours, the doping process is not efficient in time.

Figure 2:
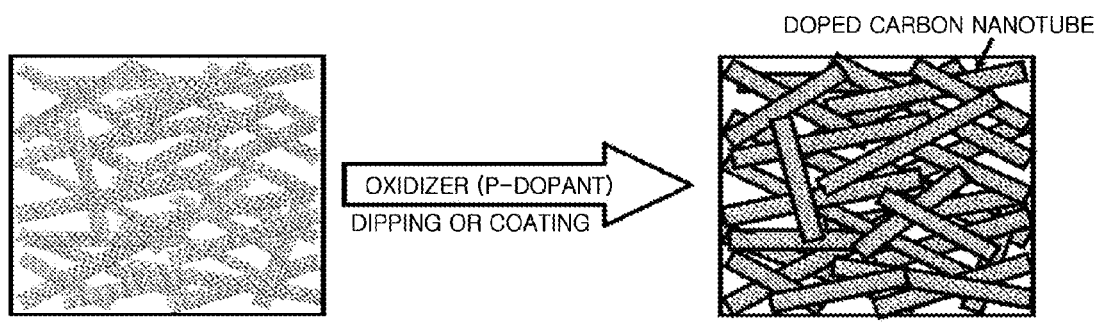
FIG. 2 schematically shows a process of forming a doped carbon nanotubes film by treating the carbon nanotubes with an oxidizer.

An optically transparent coating comprising the doped carbon nanotubes is formed on the substrate. This is illustrated in FIG. 2. Alternatively, the doped carbon nanotubes can be coated on the surface of the substrate via spray coating, electrostatic painting, brush painting, or the like. After drying, the film of carbon nanotubes is removed from the substrate. The film may be used in transparent electrodes as will be detailed later.

A single wall carbon nanotube, a thin multi wall carbon nanotube, multi wall carbon nanotubes or mixtures thereof may be used as a carbon nanotube material, without limitation. Particularly, a mean length of the carbon nanotube bundle may be in an amount of about 0.5 to about 500 micrometers. Commercially available long carbon nanotubes may be mechanically treated, for example, using a ball milling, at a low temperature to have the length range described above, and then used.

In one embodiment, the doped carbon nanotubes having improved conductivity may be used to form an electrode. Such an electrode is generally in the form of a film. In this embodiment, the carbon nanotube powder is first doped and then formed into a film on a substrate.

Alternatively, it is possible to form a film using carbon nanotubes, and then dope the carbon nanotubes in the film on the substrate. Further, it is also possible to dope carbon nanotubes powder, and form a film using the doped carbon nanotube, and then additionally dope the film on the substrate.

A conductive film comprising doped carbon nanotubes has improved surface electrical conductivity of less than $10^3$ $\Omega$/sq, and preferably in the range of 500 to 1 $\Omega$/sq. With such improvements in conductivity, a desired conductivity can be obtained using only a small amount of the carbon nanotubes, and thus transparency can be improved. Accordingly, the film may have transmittance greater than about 75%, and preferably in the range of 75 to 99%, and more preferably in the range of 75 to 90% at 550 nm while having the electrical conductivity described above and when the film has a thickness of 1 micrometer or less, preferably 500 nanometers or less.

The electrode comprising the doped carbon nanotubes has flexibility as well as improved conductivity so that the electrode can be used in various display devices such as liquid crystal displays (LCDs), organic light emitting display devices (OLEDs), and solar cells. Display devices having the flexible electrode can be easily bent so that they can be more conveniently used in a wider range of applications. A solar cell having the flexible electrode may have various curved structures according to directions of light, so that light can be efficiently used and light efficiency is improved.

When the transparent electrode comprising the doped carbon nanotubes is used in various devices, the thickness of the transparent electrode may be appropriately adjusted in consideration of transparency. For example, the transparent electrode may be formed to have a thickness in the range of 5 to 500 nm. When the thickness of the transparent electrode is greater than 500 nm, transparency may decrease and thus light efficiency may decrease. On the other hand, when the thickness of the transparent electrode is less than 5 nm, the sheet electrical resistance may increase too much, or the film may become non-uniform.

A method of preparing the electrode including the doped carbon nanotubes will now be described in detail.

First, a carbon nanotube powder is dispersed in a solvent to form a carbon nanotube ink, the carbon nanotube ink is coated on a substrate to obtain a carbon nanotube film, and then the film is doped with an oxidizer solution to prepare an electrode comprising the doped carbon nanotubes. The substrate may be optically transparent.

Examples of optically transparent substrates are glass substrates or polymeric substrate. Examples of glass substrates are silica, alumina, titania, or the like, or a combination comprising at least one of the foregoing glass substrates. Examples of polymeric substrates are polycarbonate, polyester, polysiloxane, polymethylmethacrylate, polystyrene, or the like, or a combination comprising at least one of the foregoing polymeric substrates.

Alternatively, a carbon nanotube powder is doped with the oxidizer solution, and the carbon nanotube powder is dispersed in a solvent to prepare a carbon nanotube ink, and then the ink is doped on the substrate to form a doped carbon nanotube film.

It is also possible to dope the carbon nanotube powder, and additionally dope the film prepared using the doped carbon nanotubes. When the film is additionally doped, the oxidizer used to dope the film may be the same as of different from the oxidizer used to dope the carbon nanotube powder.

Any organic solvent that has dispersibility may be used as the dispersing solvent without limitation, and the dispersing solvent may be 1,2-dichloro ethane (DCE), 1,2-dichloro benzene (ODCB), nitromethane, or the like.

The electrode including the doped carbon nanotubes has improved conductivity and excellent flexibility, and thus the electrode can be efficiently used in various devices. For example, the electrode can be used as an electrode in a solar cell, or as an electrode in various display devices such as a LCD or an OLED.

Figure 3:
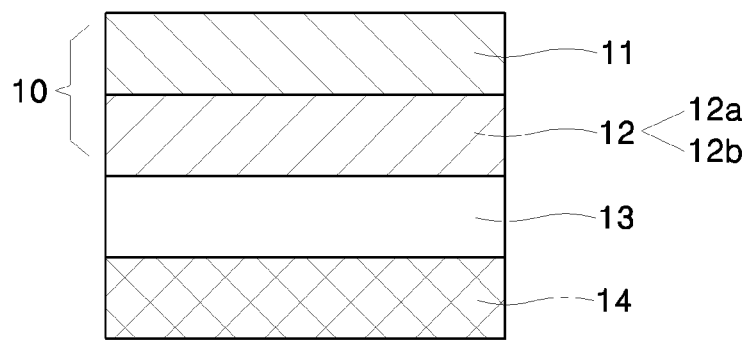
FIG. 3 schematically shows an exemplary structure of a solar cell.

A solar cell using the doped carbon nanotubes, specifically a dye-sensitized solar cell that uses the doped carbon nanotubes is illustrated in FIG. 3. The solar cell includes a semiconductor electrode 10, an electrolyte layer 13, and an opposite electrode 14. The opposite electrode 14 is disposed on a surface of the electrolyte layer 13 that is opposed to the surface that contacts the semiconductor electrode 10. The semiconductor electrode 10 includes a conductive transparent substrate 11 and a light absorbance layer 12. The conductive glass substrate is coated with a colloid solution of carbon nanotubes oxide 12a and heated in an electric furnace at a high temperature, and then a dye 12b is adsorbed thereto, thereby producing a solar cell. An electrode comprising doped carbon nanotubes having improved conductivity may be used as the conductive transparent substrate 11.

Among display devices described above, an organic light emitting display device is an active type light emitting display device in which when a current is applied to a fluorescent or phosphoric organic compound thin layer included in the display device, electrons are combined with holes in the organic compound thin layer, thereby emitting light. A conventional organic light emitting display device (not shown) comprises an anode, a hole transport layer, an emission layer, an electron transport layer, and a cathode, which are sequentially formed on a substrate. In order to easily inject electrons and holes, and the organic light emitting display device may further include an electron injection layer and a hole injection layer. Since a transparent material having high conductivity is preferable for the anode, the electrode including the doped carbon nanotubes according to an embodiment of the present invention can be used as the anode.

The electrode including the doped carbon nanotubes can also be used in other display devices such as LCD devices, electrode-chromic display (ECD) devices, and E-paper devices. When these kinds of display device materials are combined with a flexible substrate, bendable devices can be obtained. These display devices commonly include a transparent electrode having high conductivity. Accordingly, the electrode including the doped carbon nanotubes according to the present invention can be used in these kinds of display devices.

The doped carbon nanotubes having improved conductivity according to the present invention can also as applied to a thin film transistor. Here, transparency and conductivity can be improved using the doped carbon nanotubes in an electrode or a channel.

The present invention will be described in further detail with reference to the following examples. These examples are for illustrative purposes only and are not intended to limit the scope of the present invention.

EXAMPLE 1

10 mg of $NaClO_2$ as an oxidizer was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 2

10 mg of $NaClO_3$ was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 3

10 mg of $NaClO_4$ was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 4

10 mg of $AgClO_4$ was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 5

10 mg of $NaNO_2$ was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 6

10 mg of Oxone ($2KHSO_5.KHSO_4.K_2SO_4$) was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 7

10 mg of 2,3-dichloro-5,6-dicyano-p-benzoquinone (DDQ) was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 8

10 mg of 2,3-dichloro-5,6-dicyano-p-benzoquinone (DDQ) was dissolved in 10 ml of nitromethane, and 1 mg of single wall carbon nanotubes (Iljin Co., Ltd., Model No.: ASP-100F) was added to the solution, and then dispersed in a sonic bath for 10 hours.

EXAMPLE 9

10 mg of $AuCl_3$ was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 10

10 mg of $AuCl_3$ was dissolved in 10 ml of nitromethane, and 1 mg of single wall carbon nanotubes (Iljin Co., Ltd., Model No.: ASP-100F) was added to the solution, and then dispersed in a sonic bath for 10 hours.

EXAMPLE 11

10 mg of nitrosyl tetrafluoroborate (NS) was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 12

10 mg of NS was dissolved in 10 ml of nitromethane, and 1 mg of single wall carbon nanotubes (Iljin Co., Ltd., Model No.: ASP-100F) was added to the solution, and then dispersed in a sonic bath for 10 hours.

EXAMPLE 13

10 mg of Dess-Martin periodinane was dissolved in 10 ml of N-methylpyrrolidone, and 1 mg of single wall carbon nanotubes (Iljin Co., Ltd., Model No.: ASP-100F) was added to the solution, and then dispersed in a sonic bath for 10 hours.

EXAMPLE 14

10 mg of Dess-Martin periodinane was dissolved in 10 ml of nitromethane, and 1 mg of single wall carbon nanotubes (Iljin Co., Ltd., Model No.: ASP-100F) was added to the solution, and then dispersed in a sonic bath for 10 hours.

COMPARATIVE EXAMPLE 1

1 mg of single wall carbon nanotubes (Iljin Co., Ltd., Model No.: ASP-100F) was added to 10 ml of N-methylpyrrolidone, and then dispersed in a sonic bath for 10 hours.

COMPARATIVE EXAMPLE 2

10 mg of $NaNO_2$ was dissolved in 10 ml of distilled water, and 1 mg of single wall carbon nanotubes (Iljin Co., Ltd., Model No.: ASP-100F) was added to the solution, and then dispersed in a sonic bath for 10 hours.

COMPARATIVE EXAMPLE 3

10 mg of Oxone ($2KHSO_5.KHSO_4.K_2SO_4$) was dissolved in 10 ml of distilled water, and 1 mg of single wall carbon nanotubes (Iljin Co., Ltd., Model No.: ASP-100F) was added to the solution, and then dispersed in a sonic bath for 10 hours.

The doped carbon nanotubes obtained according to Examples 1 to 14, and Comparative Examples 1 to 3 were filtered using an anodisc membrane (47 mm, 0.1 μm, Whatman) to prepare carbon nanotube paper, and the carbon nanotube paper was dried overnight in a hood.

EXAMPLE 15

A film having transmittance of 84.8% at 550 nm was prepared using a single wall carbon nanotube (Iljin Co., Ltd., Model No.: ASP-100F) solution dispersed in N-methylpyrrolidone, and nitromethane was spread over the film. After 5 minutes, the film was dried and washed using spin coating, and then dried overnight in a hood.

EXAMPLE 16

A film having transmittance of 85.3% at 550 nm was prepared using a single wall carbon nanotube (Iljin Co., Ltd., Model No.: ASP-100F) solution dispersed in N-methylpyrrolidone, and a 0.025 M solution of NS dissolved in nitromethane was spread over the film. After 5 minutes, the film was dried and washed using spin coating, and then dried overnight in a hood.

EXAMPLE 17

A film having transmittance of 85.7% at 550 nm was prepared using a single wall carbon nanotube (Iljin Co., Ltd., Model No.: ASP-100F) solution dispersed in N-methylpyrrolidone, and a 0.025 M solution of $AuCl_3$ dissolved in nitromethane was spread over the film. After 5 minutes, the film was dried and washed using spin coating, and then dried overnight in a hood.

EXAMPLE 18

A film having transmittance of 85.2% at 550 nm was prepared using a single wall carbon nanotube (Iljin Co., Ltd., Model No.: ASP-100F) solution dispersed in N-methylpyrrolidone, and a 0.025 M solution of nitric acid dissolved in nitromethane was spread over the film. After 5 minutes, the film was dried and washed using spin coating, and then dried overnight in a hood.

EXAMPLE 19

100 mg of NS compound, 10 ml of untreated SWNT (Iljin Co., Ltd.), and 20 ml of nitromethane (NM) were mixed and the mixture was treated in a sonic bath for 10 hours. The resulting mixture was then filtered and dried. 2 mg of the dried carbon nanotubes was added to 20 ml of 1,2-dichloro ethane (DCE) as a dispersing solvent and dispersed in a sonic bath for 10 hours. The resulting mixture was centrifuged at 550 nm to prepare a film having transmittance of about 85%, and the film was dried overnight in air.

EXAMPLE 20

A film having transmittance of about 85% was prepared in the same manner as in Example 19 except that 1,2-dichloro benzene (ODCB) was used as the dispersing solvent.

EXAMPLE 21

A film having transmittance of about 85% was prepared in the same manner as in Example 19 except that nitromethane was used as the dispersing solvent.

COMPARATIVE EXAMPLE 4

20 ml of DCE was added to 2 mg of untreated SWNT (Iljin, Co., Ltd.) and the mixture was dispersed in a sonic bath for 10 hours. The resulting mixture was centrifuged at 550 nm to prepare a film having transmittance of about 85%.

COMPARATIVE EXAMPLE 5

A film having transmittance of about 85% was prepared in the same manner as in Comparative Example 4 except that ODCB was used as the dispersing solvent.

COMPARATIVE EXAMPLE 6

A film having transmittance of about 85% was prepared in the same manner as in Comparative Example 4 except that nitromethane was used as the dispersing solvent.

EXPERIMENTAL EXAMPLE

Sheet resistance of the doped carbon nanotubes prepared according to Examples 1 to 21 and Comparative Examples 1 to 6 was measured using a 4 point probe sheet resistance meter (Chang Min Co., CMT-series), and the results are shown in Tables 1 and 2.

TABLE 1

| | Oxidizer | Organic solvent | Sheet resistance (ohm/sq.) |
|---|---|---|---|
| Example 1 | $NaClO_2$ | N-methylpyrrolidone | 8.71 |
| Example 2 | $NaClO_3$ | N-methylpyrrolidone | 5.17 |
| Example 3 | $NaClO_4$ | N-methylpyrrolidone | 3.06 |
| Example 4 | $AgClO_4$ | N-methylpyrrolidone | 7.67 |
| Example 5 | $NaNO_2$ | N-methylpyrrolidone | 5.70 |
| Example 6 | Oxone | N-methylpyrrolidone | 9.20 |
| Example 7 | DDQ | N-methylpyrrolidone | 4.69 |
| Example 8 | DDQ | Nitromethane | 3.62 |
| Example 9 | $AuCl_3$ | N-methylpyrrolidone | 3.66 |
| Example 10 | $AuCl_3$ | Nitromethane | 1.76 |
| Example 11 | NS | N-methylpyrrolidone | 4.03 |
| Example 12 | NS | Nitromethane | 1.40 |
| Example 13 | Dess-Martin periodinane | N-methylpyrrolidone | 6.96 |
| Example 14 | Dess-Martin periodinane | Nitromethane | 3.79 |
| Comparative Example 1 | — | N-methylpyrrolidone | 10.5 |
| Comparative Example 2 | $NaNO_2$ | distilled water | 49.56 |
| Comparative Example 3 | Oxone | distilled water | 134.00 |

As shown in Table 1, conductivity of the carbon nanotubes prepared by p-doping using the oxidizer according to Examples 1 to 14 was improved compared to the undoped carbon nanotubes according to Comparative Example 1.

Particularly, sheet resistance of the carbon nanotubes prepared according to Comparative Examples 2 and 3 in which distilled water was used as a solvent instead of an organic solvent was quite high compared to Examples 5 and 6 although the same oxidizer used in the Examples 5 and 6 was used. These results are obtained since the effect of oxidizer treatment is negligible because of hydrophobic properties of the carbon nanotubes.

TABLE 2

| | Oxidizer | Organic solvent | Sheet resistance (ohm/sq.) Before doping | Sheet resistance (ohm/sq.) After doping | Reduction |
|---|---|---|---|---|---|
| Example 15 | nitromethane | — | 1299.4 | 642.9 | 50.5% |
| Example 16 | NS | nitromethane | 1605.4 | 374.6 | 76.7% |
| Example 17 | $AuCl_3$ | nitromethane | 1849.0 | 274.1 | 85.2% |
| Example 18 | Nitric acid | nitromethane | 1201.8 | 322.6 | 73.2% |

Sheet resistance was reduced by greater than 50% in Examples 15 to 18 as a result of doping the carbon nanotubes on the film.

TABLE 3

| | Oxidizer | Organic solvent | Dispersing solvent | Sheet resistance (ohm/sq.) |
|---|---|---|---|---|
| Example 19 | NS | nitromethane | DCE | 347.37 |
| Example 20 | NS | nitromethane | ODCB | 442.50 |
| Example 21 | NS | nitromethane | Nitromethane | 326.87 |
| Comparative Example 4 | — | — | DCE | 6024.00 |
| Comparative Example 5 | — | — | ODCB | 2683.00 |
| Comparative Example 6 | — | — | Nitromethane | 1462.57 |

As shown in Table 3, sheet resistance of the carbon nanotube film prepared by dispersing the doped carbon nanotubes in the organic solvent according to Examples 19 to 21 is lower than that of the carbon nanotube film prepared by dispersing the carbon nanotubes in the organic solvent according to Comparative Examples 4 to 6.

The present invention provides a method of doping carbon nanotubes in order to improving the conductivity thereof. A transparent electrode including the doped carbon nanotubes can have improved conductivity and excellent flexibility, and thus can be efficiently used in various display devices, thin film transistors, solar cells, or the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of doping carbon nanotubes, the method comprising:
    preparing an oxidizer solution comprising an oxidizer and an organic solvent, wherein the organic solvent is nitromethane, dimethyl sulfoxide, butyl nitrite, or a combination comprising at least one of the foregoing solvents; and
    disposing carbon nanotubes, alone without any dispersing agent, in the oxidizer solution in order to dope the carbon nanotubes.

2. The method of claim 1, wherein disposing the carbon nanotubes in the oxidizer solution comprises
    mixing a carbon nanotube powder with the oxidizer solution and
    stirring the mixture.

3. The method of claim 1, wherein the organic solvent promotes dispersion of the carbon nanotubes.

4. The method of claim 1, further comprising after disposing carbon nanotubes in the oxidizer solution
    adding a dispersing agent to the oxidizer solution.

5. The method of claim 1, wherein disposing the carbon nanotubes in the oxidizer solution comprises
    dipping or coating a film formed of the carbon nanotubes using the oxidizer solution.

6. The method of claim 1, wherein the oxidizer is selected from the group consisting of halogen oxides, sulfur oxides, metal halides, nitrogen oxides, metal oxyacid-based compounds, benzoquinone-based compounds, $O_3$ and $H_2O_2$.

7. The method of claim 1, wherein the organic solvent is nitromethane or a combination comprising nitromethane.

* * * * *